(12) United States Patent
Oshige

(10) Patent No.: US 11,348,888 B2
(45) Date of Patent: May 31, 2022

(54) ELECTRONIC COMPONENT AND DEVICE

(71) Applicant: CANON KABUSHIKI KAISHA, Tokyo (JP)

(72) Inventor: Hidemasa Oshige, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 46 days.

(21) Appl. No.: 16/683,919

(22) Filed: Nov. 14, 2019

(65) Prior Publication Data

US 2020/0161262 A1 May 21, 2020

(30) Foreign Application Priority Data

Nov. 20, 2018 (JP) .............................. JP2018-217569

(51) Int. Cl.
*H05K 1/02* (2006.01)
*H05K 1/11* (2006.01)
(Continued)

(52) U.S. Cl.
CPC ............... *H01L 24/05* (2013.01); *H01L 24/16* (2013.01); *H01L 24/32* (2013.01); *H01L 24/83* (2013.01);
(Continued)

(58) Field of Classification Search
CPC ......... H01L 24/05; H01L 24/32; H01L 24/83; H01L 24/16; H01L 2224/05548; H01L 2224/16225; H01L 2224/32225; H01L 2224/02381; H01L 2924/10156; H01L 2224/02371; H01L 2224/02372; H01L 2224/0231; H01L 21/30604; H01L 2224/83203; H01L 2224/13025; H01L 2224/13021; H01L 2224/13024; H01L 2224/1329; H01L 2224/13111; H01L 2224/13147; H01L 2224/13144; H01L 23/4985; H01L 24/02; H01L 2224/8192;
(Continued)

(56) References Cited

U.S. PATENT DOCUMENTS 5,648,682 A 7/1997 Nakazawa et al.
10,943,944 B2 * 3/2021 Ryu .................... H01L 27/15
(Continued)

FOREIGN PATENT DOCUMENTS

JP H05129505 A 5/1993
JP H05251619 A 9/1993
(Continued)

*Primary Examiner* — Xiaoliang Chen
(74) *Attorney, Agent, or Firm* — Canon U.S.A., Inc. I.P. Division

(57) ABSTRACT

An electronic component includes an electronic device including a substrate, and a wiring board including a conductor unit electrically connected to the electronic device and an insulation unit configured to support the conductor unit. The substrate includes a front surface including a first region, a back surface including a second region, and an end surface connecting the front surface and the back surface. The substrate further includes a first portion located between the first region and the second region and a second portion having a thickness smaller than that of the first portion. The insulation unit of the wiring board is located between a virtual plane surface located between the first region and the second region and the second portion.

19 Claims, 6 Drawing Sheets

(51) Int. Cl.
*H05K 1/14* (2006.01)
*H05K 1/18* (2006.01)
*H01L 21/02* (2006.01)
*H01L 23/13* (2006.01)
*H01L 23/34* (2006.01)
*H01L 23/36* (2006.01)
*H01L 27/32* (2006.01)
*H01L 27/148* (2006.01)
*H01L 51/00* (2006.01)
*H01L 51/52* (2006.01)
*H01L 23/00* (2006.01)
*H01L 21/306* (2006.01)

(52) U.S. Cl.
CPC ........ *H05K 1/189* (2013.01); *H01L 21/30604* (2013.01); *H01L 2224/0231* (2013.01); *H01L 2224/02371* (2013.01); *H01L 2224/02372* (2013.01); *H01L 2224/02381* (2013.01); *H01L 2224/05548* (2013.01); *H01L 2224/16225* (2013.01); *H01L 2224/32225* (2013.01); *H01L 2224/83203* (2013.01); *H01L 2924/10156* (2013.01); *H05K 2201/10121* (2013.01); *H05K 2201/10128* (2013.01)

(58) Field of Classification Search
CPC ... H01L 2224/0233; H01L 2224/05644; H01L 2224/02313; H01L 2224/02321; H01L 2224/92125; H01L 2224/73204; H01L 2924/10157; H01L 2924/10158; H01L 2224/81203; H01L 2224/0401; H01L 2224/05647; H01L 2224/05624; H01L 2224/02379; H01L 2224/81191; H01L 2224/16237; H01L 21/02; H01L 23/13; H01L 23/34; H01L 23/36; H01L 27/32; H01L 27/148; H01L 27/1464; H01L 51/00; H01L 51/52; H01L 51/5237; H01L 51/5246; H01L 51/5281; H05K 1/189; H05K 2201/10121; H05K 2201/10128; H05K 1/02; H05K 1/11; H05K 1/14; H05K 1/18; H05K 1/118; H05K 1/147; H05K 3/285; H05K 3/361; G02F 1/13452
USPC .......... 361/783, 761, 767; 174/262; 349/12, 349/138; 438/26; 257/40, 723
See application file for complete search history.

(56) References Cited

U.S. PATENT DOCUMENTS

| | | | |
|---|---|---|---|
| 2006/0108683 A1* | 5/2006 | Takeda | H01L 27/14663 257/723 |
| 2006/0240586 A1 | 10/2006 | Kobayashi et al. | |
| 2007/0253697 A1* | 11/2007 | Kim | H01L 27/14625 396/275 |
| 2007/0275488 A1* | 11/2007 | Kobayashi | H01L 27/14683 438/26 |
| 2009/0079051 A1 | 3/2009 | Amano et al. | |
| 2013/0258263 A1* | 10/2013 | Yasukawa | G02F 1/1345 349/138 |
| 2015/0062456 A1* | 3/2015 | Miyazaki | G06F 3/0446 349/12 |
| 2015/0214498 A1* | 7/2015 | Ichikawa | H01L 27/3209 257/40 |
| 2015/0373854 A1* | 12/2015 | Ikemoto | H04N 5/225 361/767 |
| 2016/0128181 A1* | 5/2016 | Yamada | H05K 1/182 361/761 |
| 2017/0048977 A1* | 2/2017 | Siddique | H01L 24/83 |
| 2018/0315952 A1* | 11/2018 | Kim | H01L 51/5253 |
| 2018/0356917 A1* | 12/2018 | Lee | H05K 3/285 |
| 2019/0312224 A1* | 10/2019 | Oshige | H01L 51/5253 |
| 2020/0119067 A1* | 4/2020 | Choi | H04N 5/341 |

FOREIGN PATENT DOCUMENTS

| | | | |
|---|---|---|---|
| JP | H08213432 A | | 8/1996 |
| JP | 2005236127 A | | 9/2005 |
| JP | 2010050260 | * | 3/2010 |
| JP | 2010050260 A | | 3/2010 |

* cited by examiner

ELECTRONIC COMPONENT AND DEVICE

BACKGROUND OF THE DISCLOSURE

Field of the Disclosure

The subject disclosure relates to an electronic component including an electronic device and a wiring board.

Description of the Related Art

An electronic component is provided with an electronic device including a substrate and a wiring board such as a printed wiring board. At least a part of the wiring board is arranged to overlap the substrate.

Japanese Patent Application Laid-Open No. 2010-050260 discusses a semiconductor image sensor which includes a photosensitive region formed on a substrate and a connection region including an electric connection unit to connect with an outside of the substrate. A thickness of a part of the substrate in the connection region is smaller than a thickness of a part of the substrate in the photosensitive region, so that a height of the semiconductor image sensor is reduced.

According to Japanese Patent Application Laid-Open No. 2010-050260, the thickness of the substrate is varied depending on a region, only to produce an effect that an amount equivalent to a height of a connection terminal (10) can be reduced. Accordingly, a size of an electronic component is not sufficiently reduced.

SUMMARY OF THE DISCLOSURE

The present disclosure is directed to the implementation of a technique advantageous for reducing a size of an electronic component.

According to one example embodiment of the disclosure, an electronic component is provided that includes an electronic device including a substrate, and a wiring board including a conductor unit electrically connected to the electronic device and an insulation unit configured to support the conductor unit. The substrate includes a front surface including a first region, a back surface including a second region, and an end surface connecting the front surface and the back surface. The substrate includes a first portion located between the first region and the second region and a second portion having a thickness smaller than that of the first portion. The insulation unit of the wiring board is located between a virtual plane surface located between the first region and the second region and the second portion.

Further features of the present disclosure will become apparent from the following description of example embodiments with reference to the attached drawings.

DESCRIPTION OF THE EMBODIMENTS

Figure 1A:
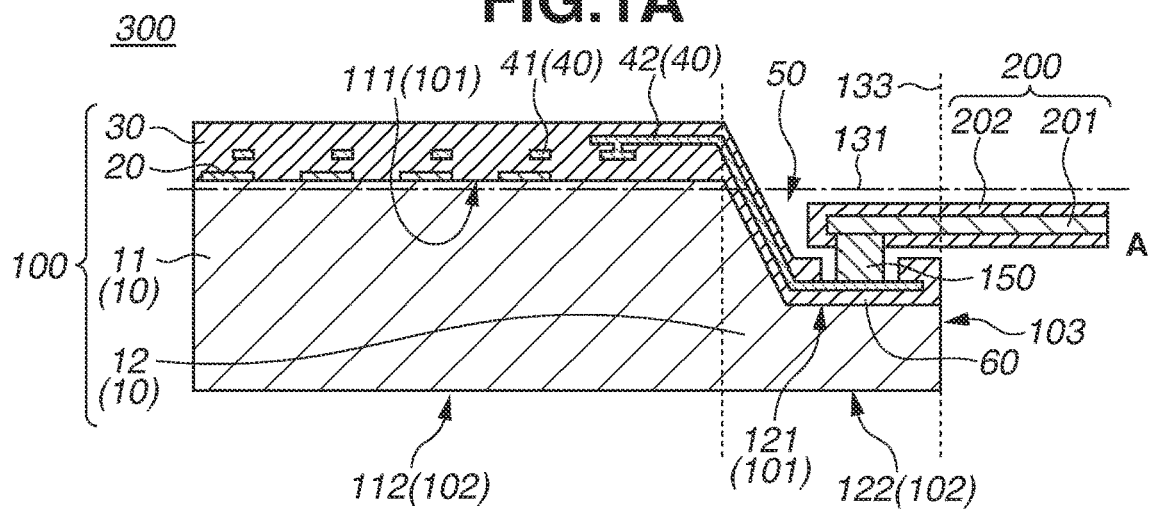
FIGS. 1A to 1C illustrate an example electronic component.

Various example embodiments and features of the present disclosure will be described in detail below with reference to the attached drawings. In the following descriptions and drawings, configurations common to a plurality of drawings are denoted by common reference numerals. The common configuration may be described by mutually referring to the plurality of drawings without notice in some cases. In addition, the configuration denoted by the common reference numeral may be omitted from the description in some cases.

Figure 1B:
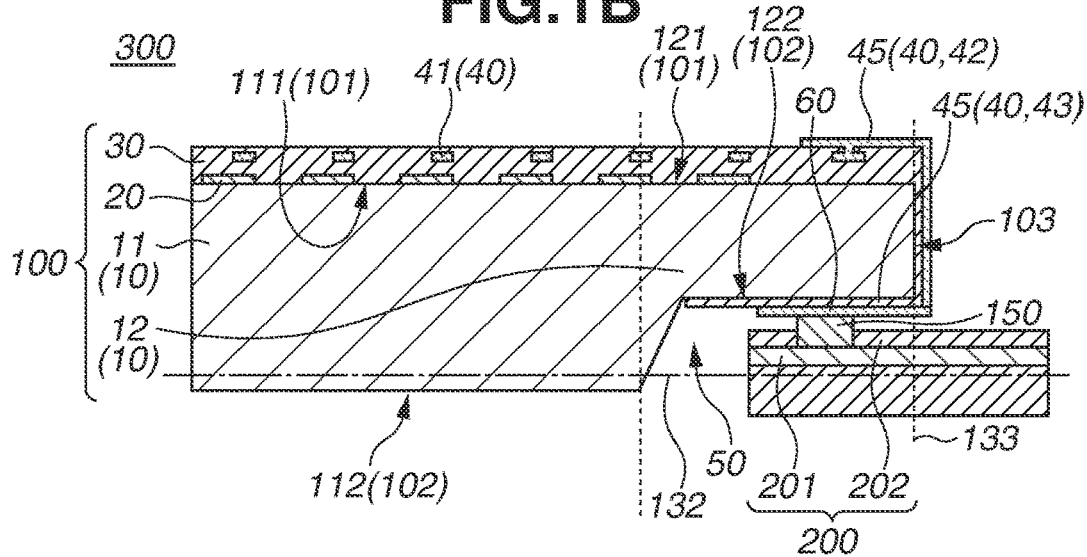
Figure 1C:
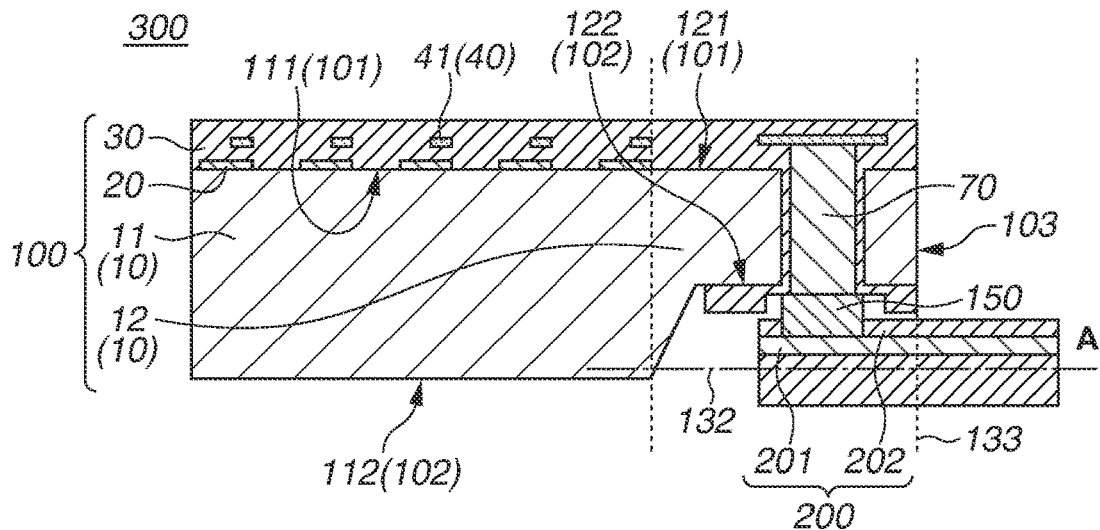

Example embodiments of an electronic component will be described with reference to FIGS. 1A to 1C. FIG. 1A is a cross-sectional schematic view of an electronic component 300 according to a first example embodiment. FIG. 1B is a cross-sectional schematic view of an electronic component 300 according to a second example embodiment. FIG. 1C is a cross-sectional schematic view of an electronic component 300 according to a third example embodiment.

The electronic component 300 is provided with an electronic device 100 including a substrate 10 and a wiring board 200. The wiring board 200 includes a conductor unit 201 electrically connected to the electronic device 100 and an insulation unit 202 supporting the conductor unit 201. The electronic device 100 is an imaging device such as a complementary metal oxide semiconductor (CMOS) image sensor and a charge coupled device (CCD) image sensor. Alternatively, the electronic device 100 is a display device such as an organic electroluminescence (EL) display and a liquid crystal display.

The wiring board 200 is typically a printed wiring board which is obtained by printing a wiring pattern as the conductor unit 201 on a rigid substrate such as a glass epoxy substrate and a composite substrate as the insulation unit 202. Alternatively, the wiring board 200 is a flexible wiring board which is obtained by forming a wiring pattern on a flexible film made of polyimide and the like as the insulation unit 202. The wiring board 200 may be a rigid flexible wiring board which is a complex of a flexible film and a rigid substrate. The wiring board 200 can supply power to the electronic device 100 from the outside of the electronic device 100. Further, the wiring board 200 inputs a signal to the electronic device 100 from the outside of the electronic device 100 and outputs a signal from the electronic device 100 to the outside of the electronic device 100.

The substrate 10 includes a front surface 101 including a center region 111 and a peripheral region 121, a back surface 102 including a center region 112 and a peripheral region 122, and an end surface 103 connecting the front surface 101 and the back surface 102. The substrate 10 includes a thick plate portion 11 located between the center region 111 and the center region 112 and a thin plate portion 12 located between the peripheral region 121 and the peripheral region 122. A thickness of the thin plate portion 12 is smaller than a thickness of the thick plate portion 11.

A semiconductor element 20 is disposed on the center region 111. The electronic device 100 includes a wiring structure disposed on the front surface 101. The wiring structure includes an insulation film 30 and a wiring group 40. According to another example embodiment which is not illustrated, a semiconductor element is disposed on the center region 112, and the electronic device 100 includes a wiring structure disposed on the back surface 102.

According to the first example embodiment (FIG. 1A), the peripheral region 121 of the front surface 101 of the substrate 10 is recessed from the center region 111, and in this way, a concave portion 50 is formed. The concave portion 50 according to the first example embodiment is a space between a virtual plane surface including the center region 111 and the peripheral region 121 of the front surface 101 of the substrate 10.

According to the second example embodiment (FIG. 1B) and the third example embodiment (FIG. 1C), the peripheral region 122 of the back surface 102 of the substrate 10 is recessed from the center region 112, and in this way, the concave portion 50 is formed. The concave portion 50 according to the second and the third example embodiments is a space between a virtual plane surface including the center region 112 and the peripheral region 122 of the back surface 102 of the substrate 10.

The insulation unit 202 of the wiring board 200 is located in the concave portion 50. In other words, the insulation unit 202 of the wiring board 200 is located between a virtual plane surface 131 between the center region 111 and the center region 112 and the thin plate portion 12. A thickness of the wiring board 200 can be fitted into the concave portion 50, and for this reason, a thickness of the electronic component 300 due to overlap of the substrate 10 and the wiring board 200 is not increased.

According to the first example embodiment (FIG. 1A), the virtual plane surface 131 is set near the center region 111 of the front surface 101. For this reason, according to the first example embodiment, a distance between the virtual plane surface 131 and the center region 111 is smaller than a distance between the center region 111 and the center region 112 (the thickness of the thick plate portion 11).

According to the second example embodiment (FIG. 1B) and the third example embodiment (FIG. 1C), the virtual plane surface 132 is set near the center region 112 of the back surface 102. For this reason, according to the second and the third example embodiments, a distance between the virtual plane surface 132 and the center region 112 is smaller than the distance between the center region 111 and the center region 112 (the thickness of the thick plate portion 11).

It is desirable that a difference in thickness between the thick plate portion 11 and the thin plate portion 12 is half or more than a thickness of a portion of the wiring board 200 overlapping the thin plate portion 12 in a direction perpendicular to the virtual plane surface 132. It is further desirable that the difference in thickness between the thick plate portion 11 and the thin plate portion 12 is greater than the thickness of the portion of the wiring board 200 overlapping the thin plate portion 12 in the direction perpendicular to the virtual plane surface 132. In this way, the wiring board 200 can be arranged such that the wiring board 200 does not protrude from the peripheral region 121 or the peripheral region 122 or such that a protrusion amount of the wiring board 200 is as small as possible.

According to the first to the third example embodiments, the wiring board 200 extends to a side opposite to the thick plate portion 11 from the end surface 103 of the substrate 10 in a direction parallel to the virtual plane surface 131 or 132. In other words, the wiring board 200 extends outwardly from the end surface 103 of the substrate 10 in a plan view. According to another example embodiment which is not illustrated, the wiring board 200 does not extend outwardly from the end surface 103 of the substrate 10 and may be positioned inside of the end surface 103.

According to the first to the third example embodiments, the thin plate portion 12 is located between at least a part of the end surface 103 (a right end portion in FIG. 1A) and the thick plate portion 11. The substrate 10 does not include a portion having a thickness greater than or equal to a thickness of the thick plate portion 11 between the thick plate portion 11 and the part of the end surface 103 (the right end portion in FIG. 1A). In other words, the substrate 10 is configured with the thin plate portion 12 up to the end surface 103. Further, in other words, the concave portion 50 according to the first example embodiment is a space surrounded by the virtual plane surface including the center region 111, the peripheral region 121 of the front surface 101 of the substrate 10, and a virtual plane surface 133 including the end surface 103. The concave portion 50 according to the second and the third example embodiments is a space surrounded by the virtual plane surface including the center region 112, the peripheral region 122 of the back surface 102 of the substrate 10, and the virtual plane surface 133 including the end surface 103.

According to the first to the third example embodiments, the wiring board 200 does not overlap the thick plate portion 11 in the direction perpendicular to the virtual plane surface 131 or 132. For this reason, the electronic component 300 has no portion with a thickness greater than or equal to a sum of the thickness of the thick plate portion 11 and the thickness of the wiring board 200. As described above, the wiring board 200 extends outwardly from the end surface 103 and thus does not overlap the thick plate portion 11. According to another example embodiment which is not illustrated, the wiring board 200 may overlap the thick plate portion 11 in the direction perpendicular to the virtual plane surface 131 or 132. It is desirable that a portion with the thickness greater than or equal to the sum of the thickness of the thick plate portion 11 and the thickness of the wiring board 200 is as small as possible in the electronic component 300. It is desirable that a width of a portion of the wiring board 200 overlapping the thick plate portion 11 is smaller than a width of a portion of the wiring board 200 overlapping the thin plate portion 12.

According to the first to the third example embodiments, a portion between the center region 111 and the center region 112 is the thick plate portion 11, and a portion between the peripheral region 121 and the peripheral region 122 is the thin plate portion 12. According to another example embodiment which is not illustrated, a portion between the center region 111 and the center region 112 may be the thin plate portion 12, and a portion between the peripheral region 121 and the peripheral region 122 may be the thick plate portion 11. Further, the insulation unit 202 of the wiring board 200 may be arranged on the concave portion 50 formed on the thin plate portion 12.

The electronic device 100 according to the first example embodiment includes a conductive layer 42 arranged across from the center region 111 to the peripheral region 122. The conductive layer 42 includes a terminal 60 connected to the wiring board 200. The terminal 60 electrically connected to the conductor unit 201 of the wiring board 200 is placed between the thin plate portion 12 and the wiring board 200. The terminal 60 is formed by a metal pattern of aluminum and the like.

The conductor unit 201 of the wiring board 200 is joined to the electronic device 100 via a conductive member 150 arranged between the wiring board 200 and the terminal 60. The conductive member 150 is, for example, an anisotropic conductive film (ACF) or a metal bump. A material of the metal bump may be an alloy such as a solder bump (solder ball).

The electronic device 100 according to the second example embodiment includes a wire 45 arranged across the front surface 101, the end surface 103, and the back surface 102. The terminal 60 electrically connected to the conductor unit 201 of the wiring board 200 is placed between the thin plate portion 12 and the wiring board 200. The terminal 60 is a part of the wire 45.

The electronic device 100 according to the third example embodiment includes a through via 70 made of copper or the like which penetrates the thin plate portion 12. The through via 70 constitutes the terminal 60 and is electrically connected to the conductor unit 201 of the wiring board 200.

The electronic component 300 according to the first example embodiment is further described. As illustrated in FIG. 1A, the electronic component 300 includes the electronic device 100 including the substrate 10, the semiconductor element 20, the insulation film 30, the wiring group 40, and the terminal 60, the conductive member 150, and the wiring board 200. The substrate 10 includes the thick plate portion 11 provided with the semiconductor element 20 and the thin plate portion 12 provided with the terminal 60 on a side of the front surface 101. The concave portion 50 is provided on the thin plate portion 12 of the substrate 10 and extends to the end surface of the substrate 10. The terminal 60 on which the insulation film 30 on the wiring group 40 is opened is arranged on a bottom surface of the concave portion 50. The electronic component 300 is configured such a way that the conductive member 150 is disposed on the terminal 60 and the wiring board 200 is joined to the electronic device 100 via the conductive member 150. In the electronic component 300 according to the first example embodiment, a joint surface of the wiring board 200 is arranged on an inner side of the concave portion 50 of the substrate 10. In other words, at least a part of the wiring board 200 is located in the concave portion 50 of the substrate 10. The substrate 10 is, for example, a semiconductor substrate made of silicon and the like, or an insulator substrate made of glass and the like. The semiconductor element 20 is arranged in the substrate 10 as the semiconductor substrate or on the substrate 10 as the insulator substrate. The semiconductor element 20 is a semiconductor element such as a transistor, a photodiode, and a light-emitting diode, an image pickup element, a light emitting element, and a display element such as a liquid crystal. The insulation film 30 is disposed on the semiconductor element 20 and the substrate 10 and may be formed of an insulating material such as silicon oxide and silicon nitride. The wiring group 40 is arranged in the insulation film 30 and is typically formed of a plurality of conductive layers and a via between the plurality of conductive layers. The wiring group 40 is made of metal such as copper and aluminum. The via is made of metal such as tungsten and electrically connects the semiconductor element 20 and the wiring group 40. It is not illustrated, but a barrier metal made of titanium, tantalum, or nitride of the respective material may be used to prevent the metals from diffusing into the substrate 10. The conductive member 150 may be made of a metal material such as a tin-silver (Sn—Ag) solder bump, a gold bump, and a copper bump, or a metal-organic composite material such as a conductive paste and an anisotropic conductive film. The wiring board 200 may be either a rigid substrate which is obtained by forming a wiring pattern on a glass epoxy base material or a low-temperature simultaneous calcination ceramics base material, or a flexible substrate which is obtained by forming a wiring pattern on a polyimide base material or a polyester base material can be used. A flexible substrate can be freely bent and thus is suitable for an electronic component to be used in a small apparatus including many components. Further, a thickness of a flexible substrate is smaller than that of a rigid substrate, so that it is desirable to use a flexible substrate in terms of height reduction of an electronic component. It is not illustrated, but it is desirable to use a resin member to fill gaps between the concave portion 50 of the electronic device 100, the wiring board 200 and the conductive member 150 in terms of prevention of corrosion at a joint portion caused by moisture. A resin member to be used can include an epoxy resin, a urethane resin, and an acrylic resin which are generally used as an underfill material. The concave portion 50 on the thin plate portion 12 of the electronic device 100 which is a feature of the electronic component 300 according to the present technique is described in detail. A sufficient depth of the concave portion 50 is half or more than a sum of thicknesses of the wiring board 200 and the conductive member 150 in terms of height reduction. For example, in a case where a flexible substrate having a thickness of 100 μm is used as the wiring board 200, and an anisotropic conductive film (ACF) having a thickness of 6 μm after joining is used as the conductive member 150, the concave portion 50 having a depth of 53 μm or more may be formed. Accordingly, the thickness of the electronic component 300 including the substrate 10 can be reduced to 53 μm or more. It is more desirable that the sum of thicknesses of the wiring board 200 and the conductive member 150 is set to 106 μm or more. The depth of the concave portion 50 is set to the sum of thicknesses of the wiring board 200 and the conductive member 150 or greater, so that the wiring board 200 does not protrude from the electronic device 100. Accordingly, the thickness of the electronic component 300 can be controlled based on a thickness of the substrate 10 and be sufficiently reduced.

Next, a manufacturing method of the electronic component 300 according to the first example embodiment is described with reference to FIGS. 2A to 2H. FIGS. 2A to 2H are process cross-sectional views of the manufacturing method of the electronic component 300 according to the first example embodiment. Known semiconductor manufacturing processes can be used for manufacturing substrates. It is not described here, but heat treatment, cleaning treatment, and the like are performed as necessary between processes.

Figure 2A:
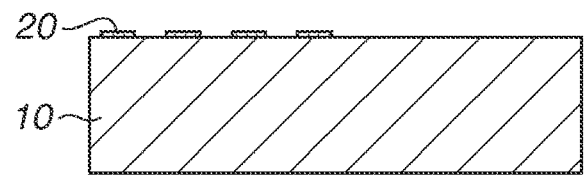
FIGS. 2A to 2H illustrate an example manufacturing method of an electronic component.

In a process in FIG. 2A, the substrate 10 made of silicon, glass, or the like is prepared, and the semiconductor element 20 such as a transistor, a photodiode, and a light-emitting diode is formed on the front surface 101 of the substrate 10 (a front surface side). An element isolation portion (not illustrated) such as shallow trench isolation (STI) is appropriately formed on the substrate 10. The semiconductor element 20 can be formed in an element portion defined by the element isolation portion and be electrically separated from an adjacent semiconductor element by the element isolation portion. According to the present example embodiment, silicon having a thickness of 725 μm is used as the substrate 10, and a plurality of semiconductor elements is formed on the substrate 10.

Figure 2B:

In a process in FIG. 2B, an insulation layer 31 is formed on the front surface 101 of the substrate 10 on which the semiconductor elements 20 are formed. As the insulation layer 31, an insulation layer made of silicon oxide, silicon nitride, silicon oxynitride, or silicon carbide is used. A conductive layer 41 is formed on the insulation layer 31 and is electrically connected to the semiconductor element 20 by a contact plug (not illustrated). The contact plug can be formed of a conductive member such as tungsten. The conductive layer 41 is made of aluminum, copper, or the like.

Figure 2C:

In a process in FIG. 2C, the concave portion 50 is formed on the thin plate portion 12 of the front surface 101 of the substrate 10. First, the center region of the substrate 10 is covered, and a resist mask (not illustrated) which is open on the peripheral region of the substrate 10 is formed. Next, the concave portion 50 having a depth of 120 μm is formed by wet etching using nitrohydrofluoric acid which is a mixed liquid of hydrofluoric acid and nitric acid. The concave portion 50 is formed by wet etching, and thus an end portion of the concave portion 50 can be formed in a tapered shape. As a result, the tapered shape can prevent disconnection of a wiring portion to be formed in a process described below due to a height difference of the concave portion 50. In addition, there is an advantage that wet etching has a faster etching rate, and the concave portion 50 can be processed in a short time. The resist mask is removed by ashing after etching.

Figure 2D:
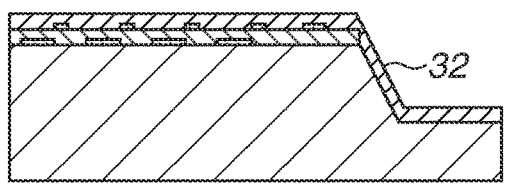

In a process in FIG. 2D, an insulation layer 32 is formed on the insulation layer 31, the conductive layer 41, and the concave portion 50. A material similar to that of the insulation layer 31 can be used for the insulation layer 32.

Figure 2E:
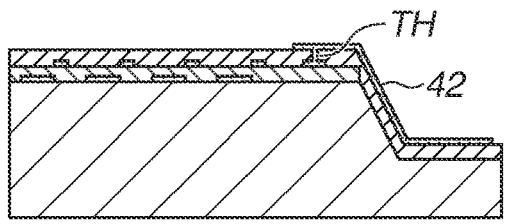

In a process in FIG. 2E, a through-hole TH to be connected to the first conductive layer 41 is formed on the insulation layer 32. Then, the second conductive layer 42 is formed on the through-hole TH and the insulation layer 32. The second conductive layer 42 is electrically connected to the first conductive layer 41 by the through-hole TH and is formed to extend from a region outside of the concave portion 50 to the bottom surface of the concave portion 50. A metal material similar to that of the first conductive layer 41 can be used for the second conductive layer 42.

Figure 2F:
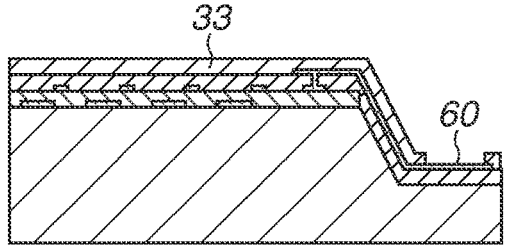

In a process in FIG. 2F, an insulation layer 33 is formed to cover at least the conductive layer 42. The insulation layer 33 on a predetermined region on the bottom surface of the concave portion 50 is removed to expose the conductive layer 42, and in this way, the terminal 60 is formed. An insulating material similar to that of the insulation layer 31 and the insulation layer 32 can be used for the insulation layer 33. For example, in a case where silicon oxide is used as the insulation layer 33, an opening is formed in the insulation layer 33 by reactive ion etching (RIE) using tetrafluoromethane (CF4)/oxygen (O2)/argon (Ar) gas system, and thus the terminal 60 can be formed. Subsequently, the thickness of the substrate 10 is reduced by back grinding until a thickness of a portion except the concave portion 50 becomes 400 μm (the thickness at the concave portion 50 is 280 μm) (not illustrated). The substrate 10 itself is thinned, and as a result, the height of the electronic component 300 including the substrate 10 can be reduced. The substrate 10 can be thinned in any of the processes in FIGS. 2A to 2E. However, the thinned substrate is difficult to handle, so that, according to the present example embodiment, thinning processing is performed in the process in FIG. 2F.

Figure 2G:
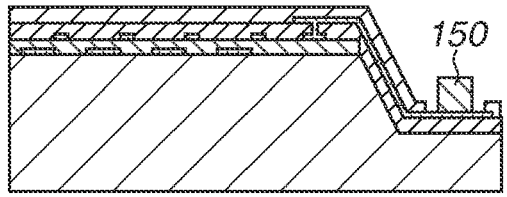

In a process in FIG. 2G, the conductive member 150 is formed on the terminal 60. As the conductive member 150, a gold bump, a Sn—Ag solder bump, a copper bump, a conductive resin, an anisotropic conductive film, or the like can be used. According to the present example embodiment, an anisotropic conductive film including conductive particles having a particle diameter of 6 μm is used.

Figure 2H:
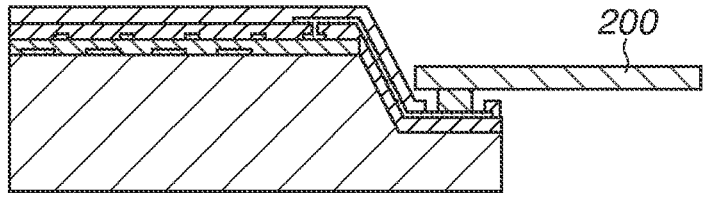

In a process in FIG. 2H, the wiring board 200 is joined to the electronic device 100 via the conductive member 150. As the wiring board 200, a rigid wiring board including a glass epoxy base material or a flexible wiring board including a polyimide base material can be arbitrarily used. According to the present example embodiment, a flexible wiring board having a thickness of 100 μm is used as the wiring board 200. An anisotropic conductive film as the conductive member 150 is formed between the terminal 60 of the electronic device 100 and the conductor unit 201 on the flexible substrate, and the substrates are electrically joined by thermal compression bonding performed at 200° C. for ten seconds. Subsequently, an underfill material including an epoxy resin is formed on a joint interface between the substrates (not illustrated). A resin member for reinforcement may be provided on the wiring board 200 in the concave portion 50 as necessary.

As described above, according to the present example embodiment, the concave portion 50 having a depth of 120 Lm is formed on the thin plate portion 12, the wiring board 200 has the thickness of 100 μm, and the conductive member 150 has the thickness of 6 μm, so that the wiring board 200 is stored in the concave portion 50 and does not protrude from the substrate 10.

Manufacturing of the electronic component according to the first example embodiment is completed as described above. A first structure of the electronic component according to the present technique is used, so that the height of the electronic component can be reduced, and accordingly, an apparatus into which the electronic component is incorporated can be smaller.

The electronic component 300 according to the second example embodiment is further described. A difference from the electronic component 300 according to the first example embodiment is that the concave portion 50 to be provided on the electronic device 100 is not on a surface (the back surface 102) opposite to an element forming surface (the front surface 101) of the electronic device 100. The wire 45 of the wiring group 40 extends to the concave portion 50 on the back surface 102 via a side surface of an end portion of the electronic device 100 and is joined to the wiring board 200 at the concave portion 50 on the back surface 102 of the electronic device 100 via the conductive member 150. A feature of the electronic component 300 according to the second example embodiment is that a joint surface on the wiring board 200 (FIG. 3F) is arranged inside of the concave portion 50 of the substrate 10 as with the first example embodiment. In other words, at least a part of the wiring board 200 is located in the concave portion 50 of the substrate 10. The substrate 10, the semiconductor element 20, the insulation film 30, the wiring group 40 and the terminal 60 of the electronic device 100, the conductive member 150, and the wiring board 200 similar to those according to the first example embodiment can be used. The insulation film 30 is arranged on a side surface of an end portion of the substrate 10 to secure an insulation property between the wiring group 40 and the substrate 10. It is not illustrated, but to cover an outer side surface of a wiring portion on the side surface of the end portion of the substrate 10 with an insulating material is preferable to prevent disconnection and short circuit of the wiring portion. The depth of the concave portion 50 can be set in a similar manner to the electronic component 300 according to the first example embodiment.

Next, a manufacturing method of the electronic component 300 according to the second example embodiment is described with reference to FIGS. 3A to 3F. FIGS. 3A to 3F are process cross-sectional views of the manufacturing method of the electronic component 300 according to the second example embodiment.

Figure 3A:
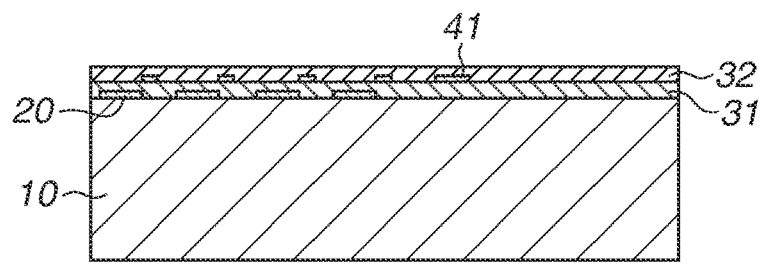
FIGS. 3A to 3F illustrate another example manufacturing method of an electronic component.

In a process in FIG. 3A, the semiconductor element 20, the insulation layer 31, and the conductive layer 41 are formed on the substrate 10, and further the insulation layer 32 is formed on the conductive layer 41 by a method similar to the manufacturing method of the electronic component 300 according to the first example embodiment illustrated in FIGS. 2A to 2H. According to the present example embodiment, silicon having a thickness of 725 µm is used as the substrate 10. A material similar to that of the insulation layer 31 can be used for the insulation layer 32.

Figure 3B:
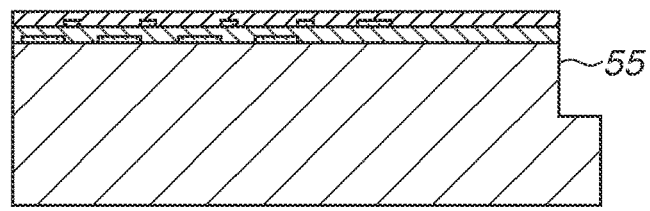

In a process in FIG. 3B, a trench 55 is formed in a region including the end surface of the substrate 10. The trench 55 is formed in such a manner that the insulation layer 31 and the insulation layer 32 on the front surface 101 of the substrate 10 are removed by dry etching, and then a via is vertically formed to a middle of the substrate 10 by Bosch process using the insulation layer 31 and the insulation layer 32 as masks. According to the present example embodiment, the trench 55 has a depth of 200 µm.

Figure 3C:
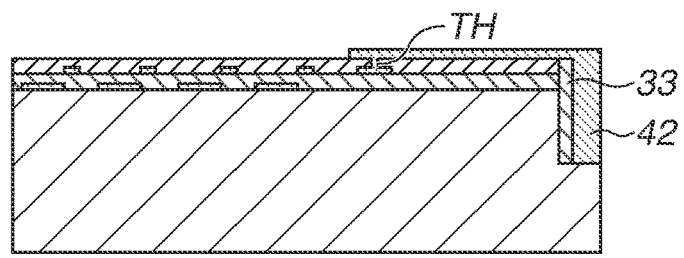

In a process in FIG. 3C, the insulation layer 33 is formed to cover the insulation layer 32 and an inside surface of the trench 55. Then, the insulation layer 33 on a bottom surface of the trench 55 is removed by etch-back performed on an entire surface. A material similar to that of the insulation layer 31 can be used for the insulation layer 33. The through-hole TH to be connected to the first conductive layer 41 is formed in the insulation layer 32. Then, the conductive layer 42 is formed on the through-hole TH and the insulation layer 32, and a first wiring layer and a second wiring layer are electrically connected to each other. The conductive layer 42 is formed on the inside surface of the trench 55. Copper is used as the conductive layer 42 according to the present example embodiment. A copper seed layer having a thickness of 500 nm is formed by sputtering, and then, the conductive layer 42 is deposited by an electrolytic plating method until a thickness the copper seed layer on a side surface of the trench 55 becomes 4 µm. Subsequently, the thickness of the substrate 10 is reduced by back-grinding to be 400 µm (not illustrated). Since the substrate 10 is subjected to the thinning processing, the depth of the concave portion 50 necessary for exposing a second wire provided in the trench 55 can be reduced in forming of the concave portion 50 described below. Further, the substrate 10 itself is thinned, and the height of the electronic component 300 including the substrate 10 can be reduced.

Figure 3D:
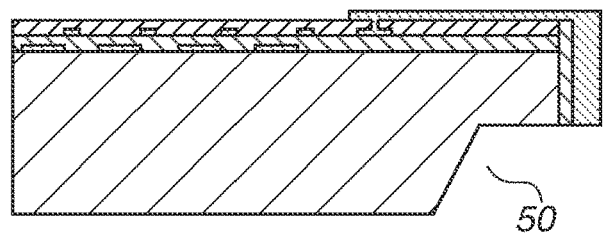

In a process in FIG. 3D, the concave portion 50 is formed from a side of the back surface 102 of the substrate 10. The concave portion 50 can be formed by a method similar to that according to the first example embodiment. In this case, the concave portion 50 having a depth of 200 µm is formed, so that the conductive layer 42 provided in the trench 55 is exposed as described above.

Figure 3E:
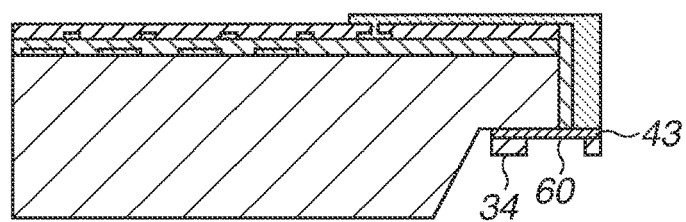

In a process in FIG. 3E, a conductive layer 43 is formed at least on an exposed region of the conductive layer 42 in the concave portion 50. A material similar to that of the conductive layer 41 can be used for a third wiring layer. Then, an insulation layer 34 which covers at least the conductive layer 43 is formed. The insulation layer 34 on a predetermined region is removed to expose the conductive layer 43, so that the terminal 60 is formed.

Figure 3F:
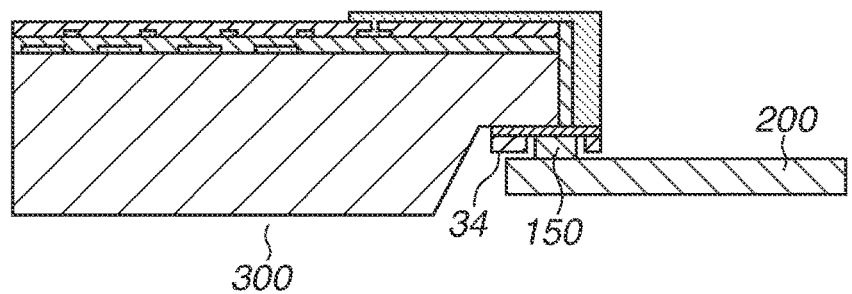

In a process in FIG. 3F, the wiring board 200 is joined to the electronic device 100 via the conductive member 150 by a method similar to the manufacturing method of the electronic component 300 according to the first example embodiment illustrated in FIGS. 2A to 2H, and in this way, manufacturing of the electronic component 300 according to the second example embodiment of the present technique is completed.

According to the present example embodiment, the wiring board 200 is joined to the substrate 10 on the back surface of the wiring board 200, so that the thick plate portion 11 can be arranged widely on the front surface 101 of the substrate 10, and an area of the substrate 10 can be reduced. A second structure of the electronic component according to the present technique is used, so that the height of the electronic component can be reduced, and accordingly, an apparatus into which the electronic component is incorporated can be smaller.

The electronic component 300 according to the third example embodiment is further described. A difference of the third example embodiment from the first and the second example embodiments is that the electronic device 100 is provided with the through via 70 which penetrates the substrate 10. The concave portion 50 is provided on the side of the back surface 102 of the electronic device 100 in a similar manner as the second example embodiment, and the through via 70 is arranged to extend from the bottom surface of the concave portion 50 to the wiring group 40 provided on the front surface 101 of the electronic device 100. A conductive member such as copper and gold is embedded in the through via 70, and the insulation film 30 is disposed on an interface between the substrate 10 and the through via 70 to secure an insulation property. As with the first and the second example embodiments, a feature of the electronic component 300 according to the third example embodiment of the present technique is that a joint surface of the wiring board 200 (FIG. 5A) is arranged inside of the concave portion 50 of the substrate 10. In other words, at least a part of the wiring board 200 is located in the concave portion 50 of the substrate 10. The substrate 10, the semiconductor element 20, the insulation film 30, the wiring group 40 and the terminal 60 of the electronic device 100, the conductive member 150, and the wiring board 200 similar to those according to the first and the second example embodiments can be used. The depth of the concave portion 50 can be set similarly as described in the first example embodiment.

Next, a manufacturing method of the electronic component 300 according to the third example embodiment is described with reference to FIGS. 4A to 4F. FIGS. 4A to 4F are process cross-sectional views of the manufacturing method of the electronic component 300 according to the third example embodiment.

Figure 4A:
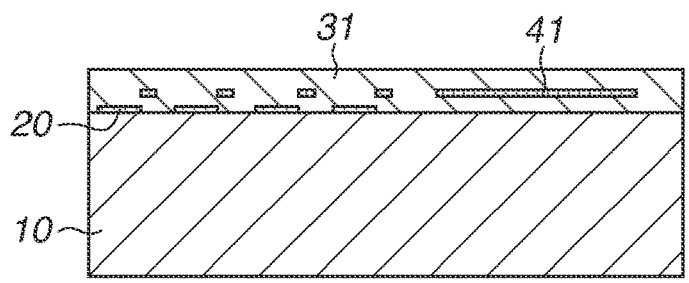
FIGS. 4A to 4F illustrate yet another manufacturing method of an electronic component.

In a process in FIG. 4A, the semiconductor element 20, the insulation layer 31, and the conductive layer 41 are formed on the substrate 10 by a method similar manner to the manufacturing method of the electronic component 300 according to the first example embodiment. According to the present example embodiment, silicon having a thickness of 725 µm is used as the substrate 10. After the conductive layer 41 is formed, the thickness of the substrate 10 is reduced by back-grinding to be 400 µm (not illustrated). Since the substrate 10 is subjected to the thinning processing, a depth of the via necessary for penetrating the substrate 10 can be reduced in a through via forming process described below. Further, the substrate 10 itself is thinned, so that the height of the electronic component 300 including the substrate 10 can be reduced.

Figure 4B:
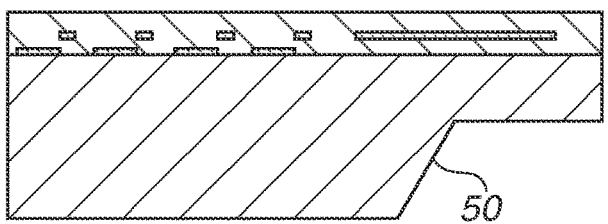

In a process in FIG. 4B, the concave portion 50 is formed on the side of the back surface 102 of the substrate 10. The concave portion 50 has a depth of 200 µm. The concave portion 50 can be formed using a method similar to that according to the first example embodiment.

Figure 4C:
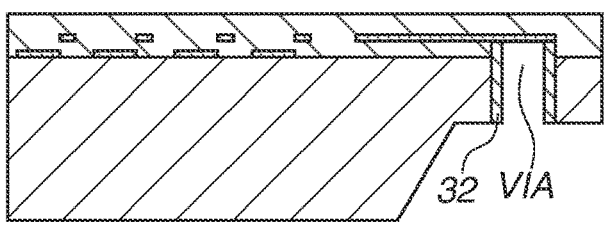

In a process in FIG. 4C, a through via VIA is formed which penetrates the substrate 10 from the bottom surface of the concave portion 50 and extends to the conductive layer 41 formed on the front surface 101 of the substrate 10. In a case where silicon and silicon oxide are used as the substrate 10 and the insulation layer 31, respectively, first, the substrate 10 is vertically processed by the Bosch process. Further, the insulation layer 31 is opened by RIE, so that the through via VIA extending to the conductive layer 41 is formed. Next, the insulation layer 32 is formed on an inside surface of the through via VIA, and the insulation layer 32 is removed only from a bottom surface of the through via VIA by etch-back performed on an entire surface to expose the conductive layer 41.

Figure 4D:
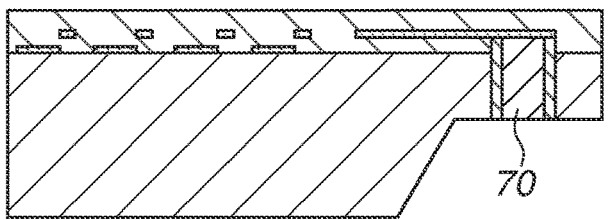

In a process in FIG. 4D, a conductive member is formed inside of the through via VIA, and accordingly, the through via 70 is formed. More specifically, a copper seed layer having a thickness of 500 nm is formed on the inside surface of the through via by sputtering, and then copper is formed by an electrolytic plating method to fill the through via.

Figure 4E:
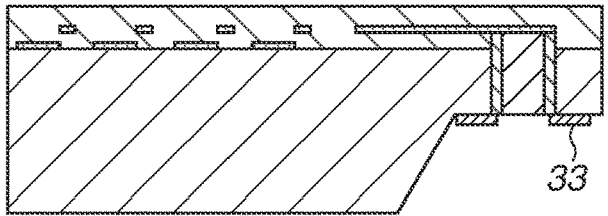

In a process in FIG. 4E, the insulation layer 33 is formed to cover the through via 70, then a predetermined region is opened to expose the through via 70, and thus the terminal 60 is formed by a method similar to the manufacturing method of the electronic component 300 according to the second example embodiment illustrated in FIG. 3F.

Figure 4F:
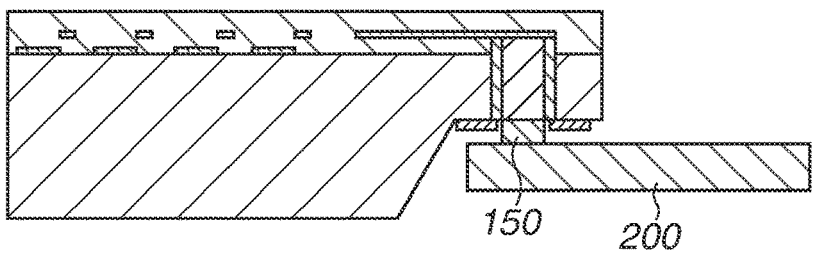

In a process in FIG. 4F, the wiring board 200 is joined to the electronic device 100 via the conductive member 150 by a method similar to the manufacturing method of the electronic component 300 according to the first example embodiment illustrated in FIGS. 2G to 2H, so that manufacturing of the electronic component 300 according to the third example embodiment of the present technique is completed.

According to the present example embodiment, the wiring board 200 is joined to the substrate 10 on the back surface of the substrate 10 in a similar manner as the second example embodiment, so that the thick plate portion 11 can be arranged widely on the front surface 101 of the substrate 10, and an area of the substrate 10 can be reduced. A third structure of the electronic component according to the present technique is used, so that the height of the electronic component can be reduced, and accordingly, an apparatus into which the electronic component is incorporated can be smaller.

Figure 5A:
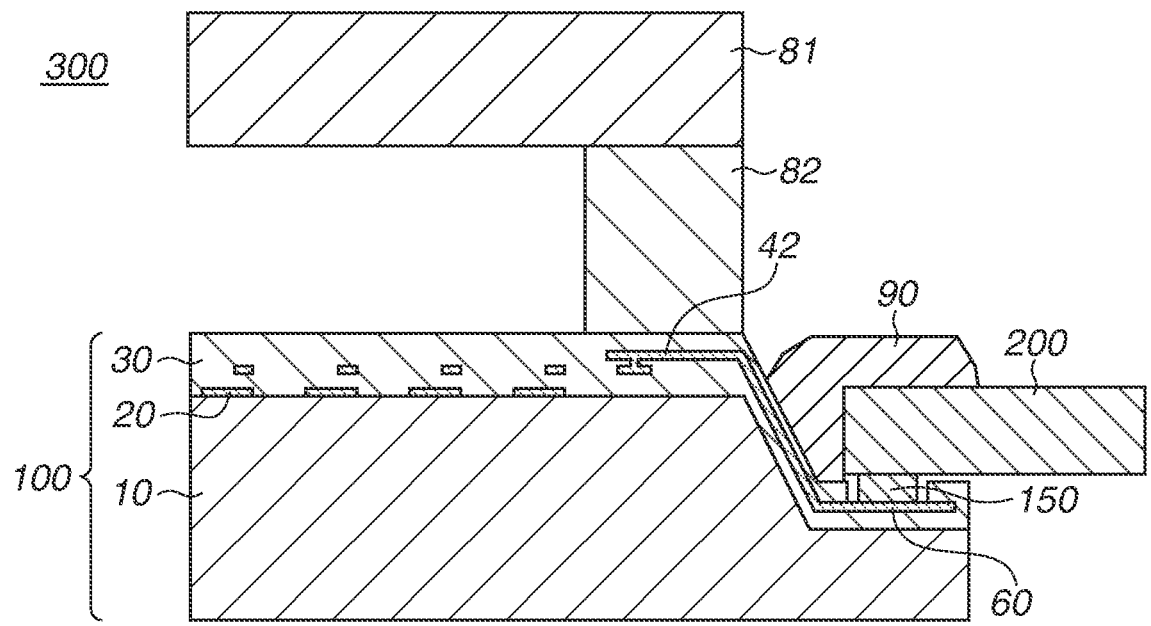
FIGS. 5A and 5B illustrate another example electronic component.
Figure 5B:
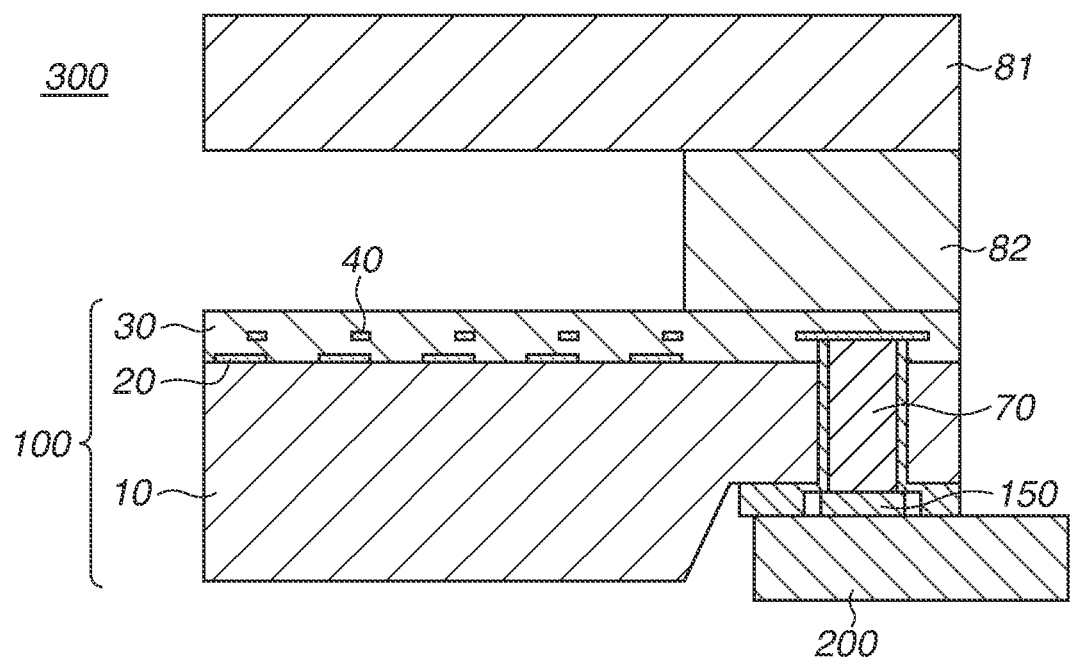

FIG. 5A is a cross-sectional schematic view of an electronic component 300 according to a fourth example embodiment. FIG. 5B is a cross-sectional schematic view of an electronic component 300 according to a fifth example embodiment.

The electronic component 300 according to the fourth and the fifth example embodiments includes a cover member 81 which overlaps the thick plate portion 11 in the direction perpendicular to the virtual plane surface 131. Further, the electronic component 300 includes a joint member 82 which is arranged between the cover member 81 and the electronic device 100 and joins the cover member 81 and the electronic device 100 with each other.

According to the fourth example embodiment, a resin member 90 for reinforcement is disposed between the wiring board 200 and the substrate 10. Accordingly, joint strength of the wiring board 200 can be enhanced. Other points of the electronic component 300 according to the fourth example embodiment are similar to those according to the first example embodiment, and the difference between the fourth example embodiment and the first example embodiment may be applied to the second, the third, and the fifth example embodiments.

According to the fifth example embodiment, the cover member 81 and the joint member 82 overlap the thin plate portion 12 in the direction perpendicular to the virtual plane surface 131. Accordingly, the thin plate portion 12 of the wiring board 200 can be reinforced. Other points of the electronic component 300 according to the fifth example embodiment are similar to those according to the third example embodiment, and the difference between the fifth example embodiment and the third example embodiment may be applied to the first, the second, and the fourth example embodiments.

Figure 6:
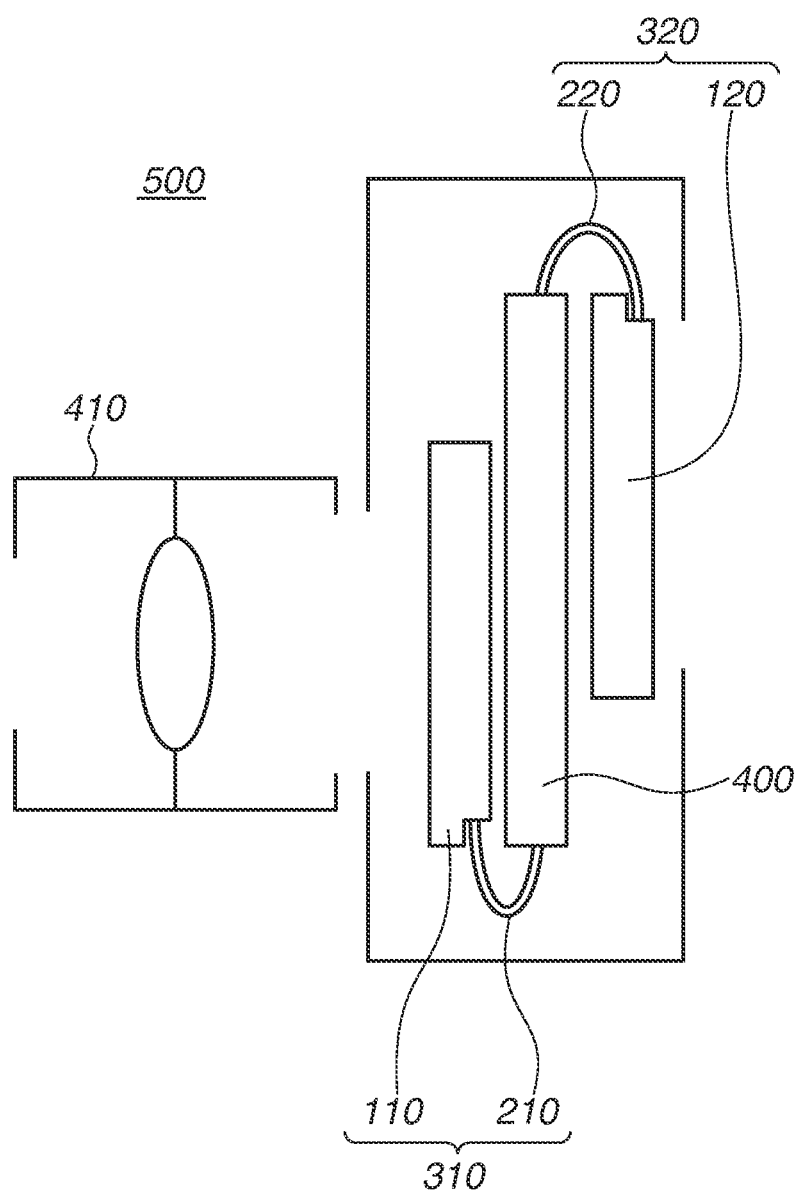
FIG. 6 illustrates another example device.

FIG. 6 is a schematic diagram illustrating an example embodiment of a device 500 to which the electronic component 300 according to any of the above-described example embodiments is applied. The device 500 is an electronic device such as a camera, a display, and a portable information terminal and may be a transport device such as a vehicle, a ship, an airplane, and a satellite, a medical device such as an endoscope and a radiation diagnostic apparatus, or an analytical instrument. The electronic component 300 is suitable for the device 500 having an imaging function and/or a display function.

The device 500 includes a circuit component 400 including an integrated circuit component and the like. A wiring board 210 of an imaging component 310 including an imaging device 110 and the wiring board 210 is connected to the circuit component 400. A wiring board 220 of a display component 320 including a display device 120 and the wiring board 220 is connected to the circuit component 400. The imaging component 310 may be the above-described electronic component 300, and in this case, the imaging device 110 and the wiring board 210 correspond to the above-described electronic device 100 and the above-described wiring board 200, respectively. The display component 320 may be the above-described electronic component 300, and in this case, the display device 120 and the wiring board 220 respectively correspond to the above-described electronic device 100 and the above-described wiring board 200. The display device 120 may be an electronic view finder. A lens 410 for forming an image on the imaging device 110 is detachable from the device 500. A reflex type or a non-reflex type camera may be adopted as the device 500.

A thickness of the electronic component 300 including the substrate 10 joined to the wiring board 200 via the conductive member 150 is a sum of thicknesses of the substrate 10, the conductive member 150, and the wiring board 200 in a case where the substrate 10, the conductive member 150, and the wiring board 200 are stacked in a vertical direction. The electronic component 300 including the substrate 10 incorporated into the device 500 is used, so that it is necessary to reduce the size of the electronic component 300. Even if the thickness of the substrate 10 is reduced by the thickness of the conductive member 150, a ratio of the thickness of the conductive member 150 is much smaller than those of the substrate 10 and the wiring board 200. However, since the concave portion 50 in which the insulation unit 202 of the wiring board 200 is arranged is provided, a smaller electronic component can be provided, so that the device 500 can be smaller or the density of components can be increased.

As described above, the present disclosure is advantageous for reducing a size of an electronic component can be provided.

While the present disclosure has been described with reference to example embodiments, it is to be understood that the disclosure is not limited to the disclosed example embodiments. The scope of the following claims is to be accorded the broadest interpretation so as to encompass all such modifications and equivalent structures and functions.

This application claims the benefit of Japanese Patent Application No. 2018-217569, filed Nov. 20, 2018, which is hereby incorporated by reference herein in its entirety.

What is claimed is:

1. An electronic component comprising:
an electronic device including a substrate;
a wiring board including a conductor unit electrically connected to the electronic device and an insulation unit configured to support the conductor unit;
a cover unit covering the substrate; and
an adhesive member being in contact with the substrate and the cover unit,
wherein a chamber comprises the substrate, the cover unit and the adhesive member,
wherein the substrate includes a front surface including a first region, a back surface including a second region, and an end surface connecting the front surface and the back surface,
wherein the substrate further includes a first portion located between the first region and the second region and a second portion having a thickness smaller than a thickness of the first portion,
wherein the insulation unit of the wiring board is located between a virtual plane surface and the second portion,
wherein the virtual plane surface is located between the first region and the second region in a direction perpendicular to the second region,
wherein the virtual plane surface is parallel to the first region, and
wherein an orthographic projection of the adhesive member to the substrate is larger than an orthographic projection of the second region to the substrate.

2. The electronic component according to claim 1, wherein a difference between the thickness of the first portion and the thickness of the second portion is half or more than a thickness of a portion of the wiring board overlapping the second portion in a direction perpendicular to the virtual plane surface.

3. The electronic component according to claim 1, wherein a difference between the thickness of the first portion and the thickness of the second portion is greater than a thickness of a portion of the wiring board overlapping the second portion in a direction perpendicular to the virtual plane surface.

4. The electronic component according to claim 1, wherein the wiring board extends outwardly from the end surface of the substrate in a direction parallel to the virtual plane surface.

5. The electronic component according to claim 1, wherein the second portion is located between at least a part of the end surface and the first portion, and the first portion is a thickest portion between the first portion and the part of the end surface.

6. The electronic component according to claim 1, wherein the wiring board does not overlap the first portion in a direction perpendicular to the virtual plane surface.

7. The electronic component according to claim 1, wherein a semiconductor element is arranged on the first region, and a distance between the virtual plane surface and the second region is greater than a distance between the first region and the second region.

8. The electronic component according to claim 1, wherein a terminal electrically connected to the conductor unit of the wiring board is located between the second portion and the wiring board.

9. The electronic component according to claim 7, wherein the electronic device is provided with a through via penetrating the second portion.

10. The electronic component according to claim 1, wherein the substrate is a semiconductor substrate.

11. The electronic component according to claim 1, wherein the wiring board is a flexible wiring board.

12. The electronic component according to claim 1, wherein the wiring board is joined to the electronic device via an anisotropic conductive film or a metal bump.

13. The electronic component according to claim 1, further comprising:
a cover member configured to overlap the first portion in a direction perpendicular to the virtual plane surface; and
a joint member arranged between the cover member and the electronic device and configured to join the cover member and the electronic device.

14. The electronic component according to claim 13, wherein the cover member and the joint member overlap the second portion in athe direction perpendicular to the virtual plane surface.

15. The electronic component according to claim 1, wherein the electronic device is an imaging device.

16. The electronic component according to claim 1, wherein the electronic device is a display device.

17. The electronic component according to claim 1, wherein the orthographic projection of the second region to the substrate is included in the orthographic projection of the adhesive member to the substrate.

18. A device comprising:
an electronic device including a substrate;
a wiring board including a conductor unit electrically connected to the electronic device and an insulation unit configured to support the conductor unit; and
a cover unit covering the substrate, and
an adhesive member being in contact with the substrate and the cover unit,
wherein a chamber comprises the substrate, the cover unit and the adhesive member,
wherein the substrate includes a front surface including a first region, a back surface including a second region, and an end surface connecting the front surface and the back surface,
wherein the substrate further includes a first portion located between the first region and the second region and a second portion having a thickness smaller than a thickness of the first portion,
wherein the insulation unit of the wiring board is located between a virtual plane surface and the second portion,
wherein the virtual plane surface is located between the first region and the second region in a direction perpendicular to the second region,
wherein the virtual plane surface is parallel to the first region, and
wherein an orthographic projection of the adhesive member to the substrate is larger than an orthographic projection of the second region to the substrate.

19. The electronic component according to claim 18, wherein the orthographic projection of the second region to the substrate is included in the orthographic projection of the adhesive member to the substrate.

\* \* \* \* \*